US008810308B2

(12) United States Patent
Lin et al.

(10) Patent No.: US 8,810,308 B2
(45) Date of Patent: Aug. 19, 2014

(54) FILTERS WITH ORDER ENHANCEMENT

(71) Applicant: MediaTek Inc., Hsin-Chu (TW)

(72) Inventors: Yu-Hsin Lin, Taipei (TW); Hung-Chieh Tsai, Tainan (TW); Chi-Lun Lo, Yangmei Township, Taoyuan County (TW); Chen-Yen Ho, New Taipei (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 13/758,028

(22) Filed: Feb. 4, 2013

(65) Prior Publication Data

US 2013/0207718 A1    Aug. 15, 2013

Related U.S. Application Data

(60) Provisional application No. 61/596,854, filed on Feb. 9, 2012.

(51) Int. Cl.
*H03K 5/00*  (2006.01)
*H03H 11/12*  (2006.01)

(52) U.S. Cl.
CPC ....... *H03H 11/1204* (2013.01); *H03H 11/1252* (2013.01); *H03H 11/126* (2013.01)
USPC .......................................... 327/558

(58) Field of Classification Search
USPC .................... 327/336–337, 551–559
See application file for complete search history.

(56) References Cited

U.S. PATENT DOCUMENTS

| 4,253,069 A | * | 2/1981 | Nossek | 330/107 |
| 5,635,871 A | * | 6/1997 | Cavigelli | 330/107 |
| 2012/0212288 A1 | * | 8/2012 | Masui et al. | 327/557 |

* cited by examiner

*Primary Examiner* — Dinh Le
(74) *Attorney, Agent, or Firm* — McClure, Qualey & Rodack, LLP (57) ABSTRACT

A filter is provided. The filter receives an input signal and generates an output signal according to the input signal. The filter includes an input network, a high-pass network, and an operational circuit. The first input network provides a first normal path for the input signal to generate a first normal signal. The first high-pass network provides a first high-pass path for the input signal to generate a first high-pass signal. The operational circuit has first and second input terminals. The polarity of the second input terminal is inverse to that of the first input terminal. The operational circuit receives the first normal signal by the first input terminal and the first high-pass signal by the second input terminal such that a subtraction operation is performed on the first normal signal and the first high-pass filter to accomplish a low-pass filtering operation for generating the output signal.

19 Claims, 9 Drawing Sheets

FILTERS WITH ORDER ENHANCEMENT

CROSS REFERENCE TO RELATED APPLICATIONS

This application claims the benefit of U.S. Provisional Application No. 61/596,854, filed on Feb. 9, 2012, the contents of which are incorporated herein by reference.

BACKGROUND OF THE INVENTION

1. Field of the Invention

The invention relates to a filter, and more particularly, to a filter whose order is enhanced by applying a high-pass network for an input signal.

2. Description of the Related Art

Generally, attenuation of a filter can be enhanced by increasing the order of the filter. It has been known that the value of the order of the filter is equal to the number of operational amplifiers in the filter. Moreover, the number of feedback capacitors of the filter is also increased with the increment of the order of the filter. Thus, when a filter is required to have a high order, the number of operational amplifiers in the filter and the number of feedback capacitors become larger, resulting in a large area occupied by the filter.

BRIEF SUMMARY OF THE INVENTION

Thus, it is desirable to provide a filter which can have an enhanced order by applying a high-pass network for an input signal without the increased number of operational amplifiers.

An exemplary embodiment of a filter is provided. The filter receives an input signal and generates an output signal according to the input signal. The filter comprises an input network, a high-pass network, and an operational circuit. The first input network provides a first normal path for the input signal to generate a first normal signal. The first high-pass network provides a first high-pass path for the input signal to generate a first high-pass signal. The operational circuit has a first input terminal and a second input terminal, and the polarity of the second input terminal is inverse to that of the first input terminal. The operational circuit receives the first normal signal by the first input terminal and the first high-pass signal by the second input terminal such that a subtraction operation is performed on the first normal signal and the first high-pass filter to accomplish a low-pass filtering operation for generating the output signal.

Another exemplary embodiment of a filter is provided. The filter receives an input signal at a first differential node and a second differential node and generates an output signal according to the input signal. The filter comprises an operational amplifier, first and second input networks, first and second high-pass networks, and first and second feedback networks. The operational amplifier has a positive input terminal, a negative input terminal, a negative output terminal, and a positive output terminal. The first input network is coupled between the first differential node of the filter and the positive input terminal of the operational amplifier. The first input network provides a first normal path for the input signal to generate a first normal signal. The first high-pass network is coupled between the first differential node of the filter and the negative input terminal of the operational amplifier. The first high-pass network provides a first high-pass path for the input signal to generate a first high-pass signal. The second input network is coupled between the second differential node of the filter and the negative input terminal of the operational amplifier. The second input network provides a second normal path for the input signal to generate a second normal signal. The second high-pass network is coupled between the second differential node of the filter and the positive input terminal of the operational amplifier. The second high-pass network provides a second high-pass path for the input signal to generate a second high-pass signal. The first feedback network is coupled between the positive input terminal and the negative output terminal of the operational amplifier. The second feedback network is coupled between the negative input terminal and the positive output terminal of the operational amplifier.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
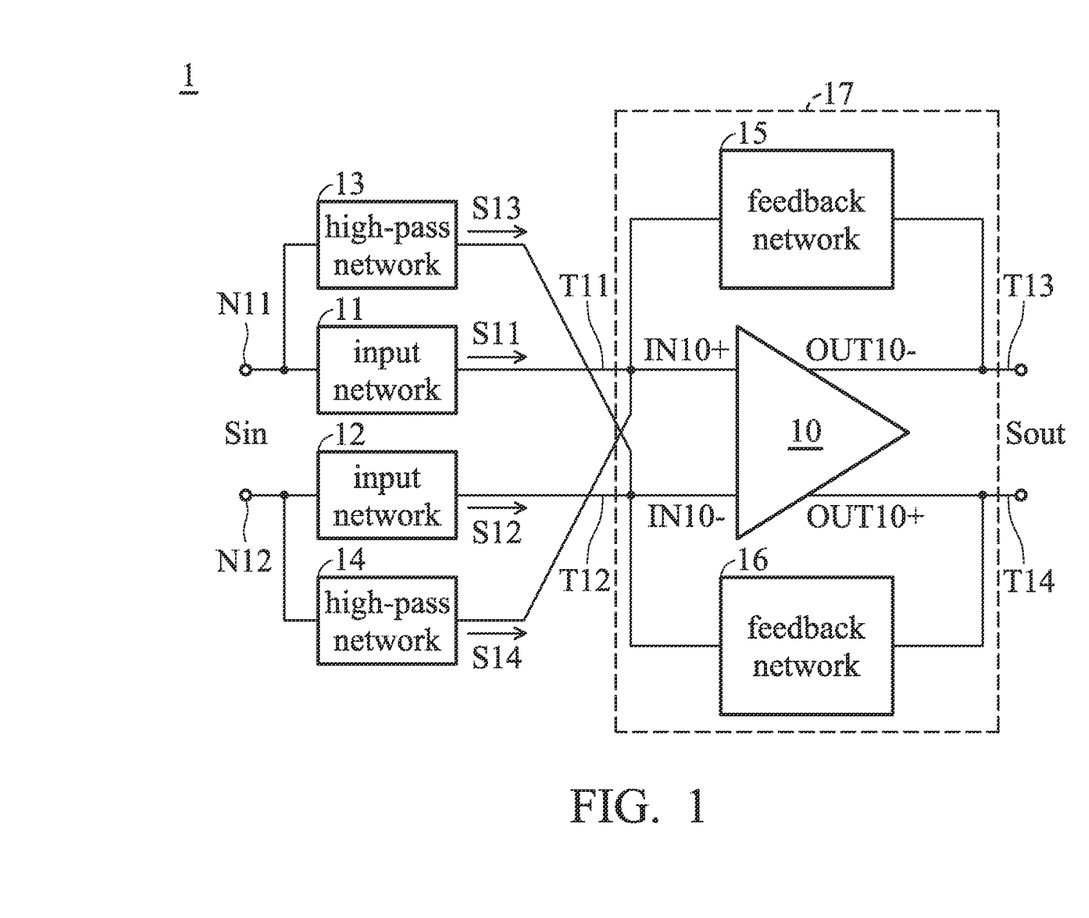
FIG. 1 shows an exemplary embodiment of a second-order filter.

FIG. 1 shows an exemplary embodiment of a filter. In the embodiment of FIG. 1, a filter 1 is a second-order filter. The second-order filter 1 receives an input signal Sin at differential nodes N11 and N12 and generates an output signal Sout according to the input signal Sin. Referring to FIG. 1, the filter 1 comprises an operational circuit 17 having at least a first input terminal T11, a second input terminal T12, a first output terminal T13, and a second output terminal T14, input networks 11 and 12, and high-pass networks 13 and 14. The polarity of the second input terminal T12 is inverse to the polarity of the first input terminal T11. The polarity of the first input terminal T13 is inverse to the polarity of the first input terminal T11, and the polarity of the second output terminal T14 is inverse to the polarity of the second input terminal T12. For example, the operational circuit 17 may comprises an operational amplifier 10 and feedback networks 15 and 16. The operational amplifier 10 has a positive input terminal IN10+ coupled to the first input terminal T11 of the operational circuit 17, a negative input terminal IN10− coupled to the second input terminal T12 of the operational circuit 17, a positive output terminal OUT10+ coupled to the second output terminal T14, and a negative output terminal OUT10− coupled to the first output terminal T13. The input network 11 is coupled between the differential node N11 and the positive input terminal IN10+. The input network 12 is coupled between the differential node N12 and the negative input terminal IN10−. Each of the input networks 11 and 12 provides a normal path for the input signal Sin to generate a corresponding normal signal S11/S12, wherein each of the normal signals S11 and S12 has the same frequency components as the input signal Sin. The difference between the normal signals S11 and S12 is the polarity as the input signal Sin in this embodiment is a differential signal. That is, the polarity of the normal signal S11 is inverse to that of the normal signal S12. The high-pass network 13 is coupled between the differential node N11 and the negative input terminal IN10−. The high-pass network 14 is coupled between the differential node N12 and the positive input terminal IN10+. Each of the high-pass networks 13 and 14 performs a high-pass filtering operation (HPF) to provide a high-pass path for the input signal Sin to generate a corresponding high-pass signal S13/S14. The high-pass networks 13 and 14 filter the low-frequency components of the input signal Sin to generate the high-pass signals S13 and S14, such that the each of high-pass signals S13 and S14 has only the high-frequency components of the input signal Sin. The difference between the high-pass signals S13 and S14 is the polarity as the input signal Sin in this embodiment is a differential signal. That is, the polarity of the high-pass signal S13 is inverse to that of the high-pass signal S14.

Figure 2:
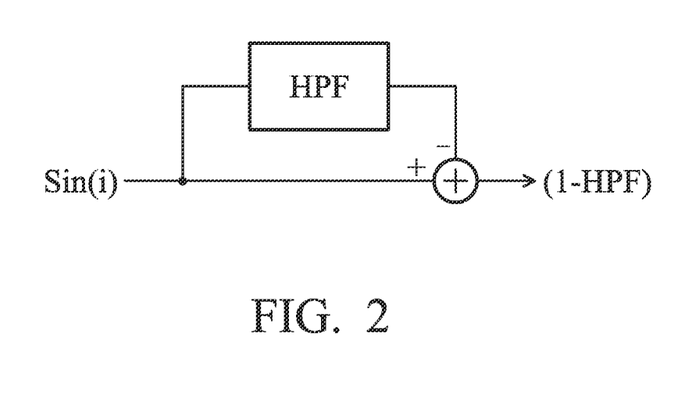
FIG. 2 is a schematic view showing a subtraction operation performed by an operational amplifier in FIG. 1.

The feedback network 15 is coupled between the positive input terminal IN10+ and the negative output terminal OUT10−, and the feedback network 16 is coupled between the negative input terminal IN10− and the positive output terminal OUT10+. The operational amplifier 10, the input networks 11 and 12, and the feedback networks 15 and 16 collectively operate to perform a low-pass filtering operation to the input signal Sin. Accordingly, one pole in the frequency response is introduced for the input signal Sin. In addition, the operational amplifier 10 receives the normal signal S11 by the positive input terminal IN10+ and receives the high-pass signal S13 by the negative input terminal IN10−. According to the virtual ground of the operation amplifier 10, the operation amplifier 10 of the operational circuit 17 equivalently performs a subtraction operation to the normal signal S11 and the high-pass signal S13. As shown in FIG. 2, in the frequency response, the operational amplifier 10 accomplishes one low-pass filtering operation by subtracting the high-frequency components (represented by "HPF") of the input signal Sin from the whole frequency components (represented by "1") of the signal Sin. Similarly, for the inverse polarity, the operation amplifier 10 of the operational circuit 17 also equivalently performs the subtraction operation to the normal signal S12 and the high-pass signal S14 to accomplish the low-pass filtering operation. Accordingly, by respectively coupling the high-pass networks 13 and 14 to the input terminals of the operational amplifier 10 that have inverse polarity to the input terminals the input networks 11 and 12 are coupled to, one extra pole can be introduced in the frequency response for the input signal Sin. Therefore, the filter 1 can utilize one operational amplifier (e.g. the operational amplifier 10) to realize a two-pole system, such as a second-order filter which will be illustrated later. Compared with the conventional second-order filters comprising two operational amplifiers, the filter 1 in the embodiment can save one operational amplifier for the second-order filtering operation.

Figure 3A:
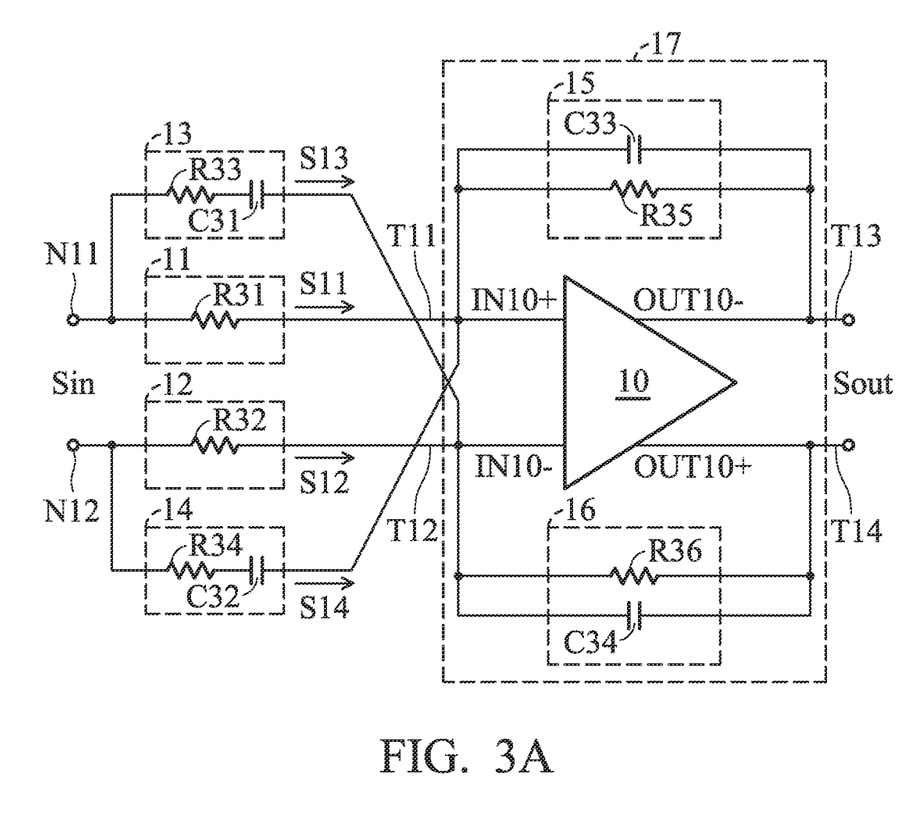
FIGS. 3A-3C shows other exemplary embodiments of a second-order filter.

In one exemplarity embodiment, as shown in FIG. 3A, the input network 11 comprises a resistor R31 having one terminal coupled to the differential node N11 and the other terminal coupled to the positive input terminal IN10+. The input network 12 comprises a resistor R32 having one terminal coupled to the differential node N12 and the other terminal coupled to the negative input terminal IN10−. The high-pass network 13 comprises a resistor R33 and a capacitor C31 which are coupled in series between the differential node N11 and the negative input terminal IN10−. The high-pass network 14 comprises a resistor R34 and a capacitor C32 which are coupled in series between the differential node N12 and the positive input terminal IN10+. According to the above, the resistors R33 and R34 and the capacitors C31 and C32 introduce one pole in the frequency response for the input signal Sin. The feedback network 15 comprises a capacitor C33 and a resistor R35 which are coupled in parallel between the positive input terminal IN10+ and the negative output terminal OUT10−. The feedback network 16 comprises a capacitor C34 and a resistor R36 which are coupled in parallel between the negative input terminal IN10− and the positive output terminal OUT10+. According to the connection structure shown in FIG. 3A, the operational amplifier 10, the resistors R31, R32, R35, and R36, and the capacitors C33 and C34 collectively operate as a low-pass filter, and the resistors R35 and R36, and the capacitors C33 and C34 introduce one pole in the frequency response. The analysis of the frequency response is shown in the following paragraph.

In the embodiment, the input signal Sin is a differential signal, and it is preferable that the differential paths are provided in the filter 1 for the input signal Sin. Thus, the resistance values of the resistors R31 and R32 are equal to R1, the resistance values of the resistors R33 and R34 are equal to R2, and the resistance values of the resistors R35 and R36 are equal to R3. The capacitance value of the capacitors C31 and C32 are equal to C1, and the capacitance value of the capacitors C33 and C34 are equal C2. In the embodiment, the operational amplifier 10 may be implemented by a multi-stage operational amplifier.

The transfer function of the filter 1 is shown by:

$$\frac{1}{C1C2R1R2} * \left( \frac{s*C1(R1-R2)-1}{s^2 + s\frac{C2R3+C1R2}{C1C2R2R3} + \frac{1}{C1C2R2R3}} \right) \quad (1)$$

when R1 is set to be substantially equal to R2 (that is the resistance values of the resistors R31-R34 are substantially equal), the transfer function is rewritten as:

$$\frac{1}{C1C2R1R2} * \left( \frac{1}{s^2 + s\frac{C2R3+C1R2}{C1C2R2R3} + \frac{1}{C1C2R2R3}} \right) \quad (2)$$

According to the transform function (2), there are two poles in the frequency response. Thus, the filter 1 performs a second-order filtering operation to the input signal Sin by using one operation amplifier 10. The number of operation amplifiers in the filter 1 is less than the order of the filter 1.

Figure 3B:
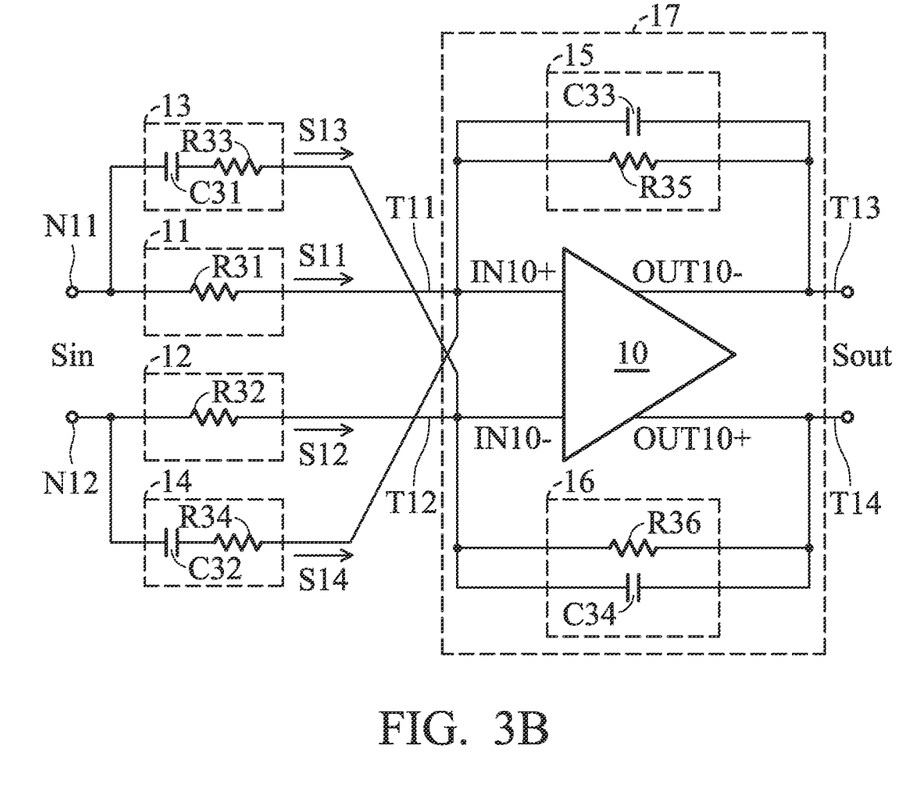

In the embodiment of FIG. 3A, the resistors R33 and R34 are coupled to the differential nodes N11 and N12, respectively, to receive the input signal Sin, the capacitor C31 is coupled between the resistor R33 and the negative input signal IN10−, and the capacitor C32 is coupled between the resistor R33 and the positive input signal IN10+. In another embodiment, the positions of the resistor R33 and the capacitor C31 can be exchanged, and the positions of the resistor R34 and the capacitor C32 can be exchanged. As shown in FIG. 3B, the capacitors C31 and C32 are coupled to the differential nodes N11 and N12, respectively, to receive the input signal Sin, the resistor R33 is coupled between the capacitors C31 and the negative input signal IN10−, and the resistor 34 is coupled between the capacitor C32 and the positive input signal IN10+.

Figure 3C:
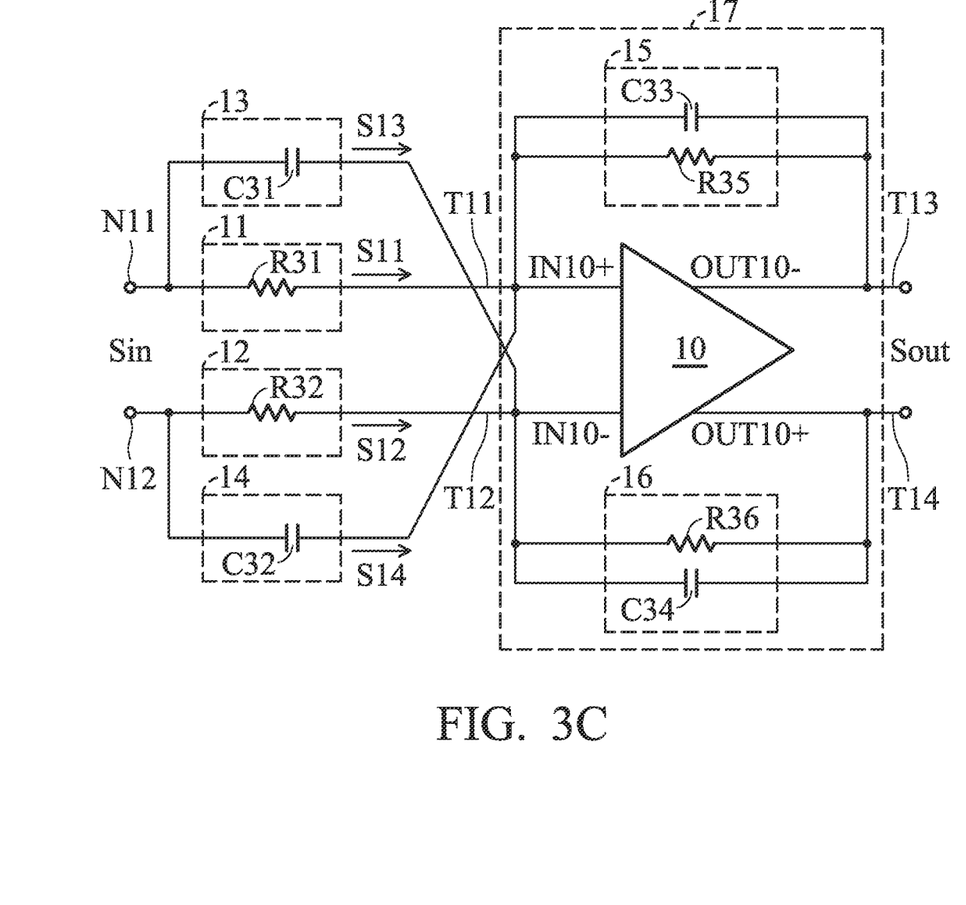

In further another embodiment, each of the high-pass networks 13 and 14 comprises only one capacitor without any resistor. As shown in FIG. 3C, the high-pass network 13 comprises only the capacitor C31, while the high-pass network 14 comprises only the capacitor C32. The capacitors C31 and C32 can filter the low-frequency components of the input signal Sin.

Figure 4:
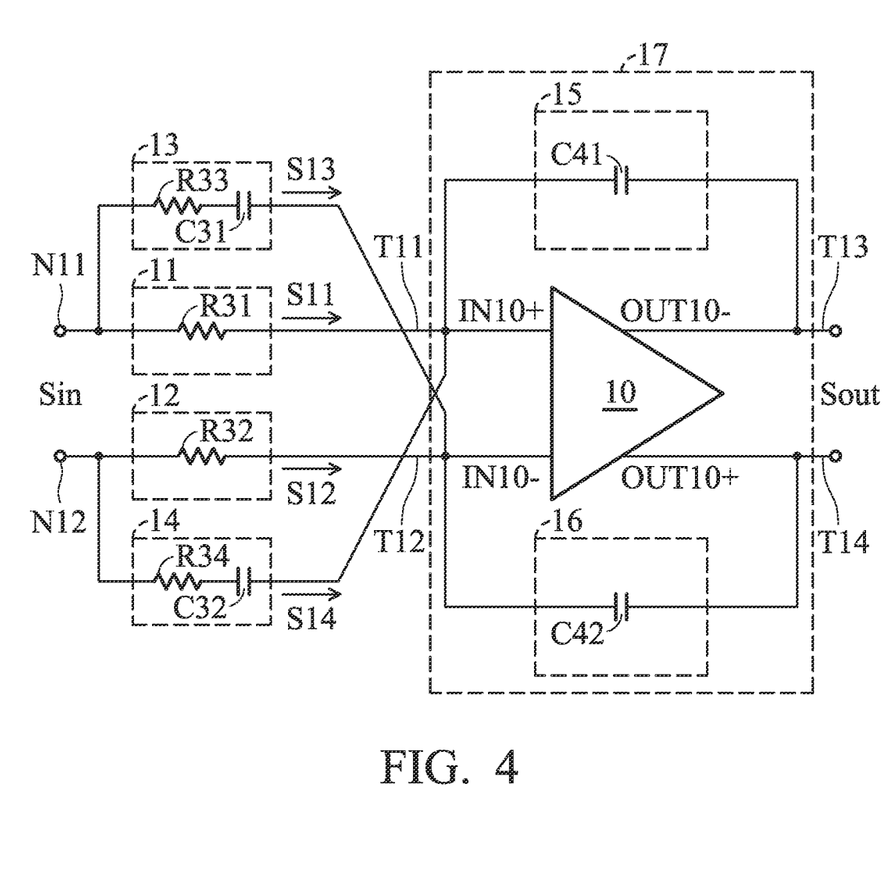
FIG. 4 shows another exemplary embodiment of a second-order filter.

In the embodiment of FIG. 3A, the operation amplifier 10, the input networks 11 and 12, and the feedback networks 15 and 16 collectively operate as a low-pass filter. In another embodiment, the operation amplifier 10, the input networks 11 and 12, and the feedback networks 15 and 16 may collectively operate as an integrator. As shown in FIG. 4, different from the feedback networks 15 and 16 in FIG. 3A, each of the feedback networks 15 and 16 comprises only a capacitor without any resistors. Referring to FIG. 4, the feedback network 15 comprises a capacitor C41 coupled between the positive input terminal IN10+ and the negative output terminal OUT10−, and the feedback network 16 comprises a capacitor C42 coupled between the negative input terminal IN10− and the positive output terminal OUT10+. The input networks 11 and 12 and the high-pass networks 13 and 14 in FIG. 4 have the same circuit structures as those in FIG. 3A. Moreover, in other embodiments, the high-pass networks 13 and 14 in FIG. 4 may have the same circuit structures as those in FIG. 3B or 3C. The operational amplifier 10, the resistors R31 and R32, and the capacitors C41 and C42 collectively operate as an integrator to introduce one pole in the frequency response, while the high-pass networks 13 and 14 introduce another pole.

Figure 5:
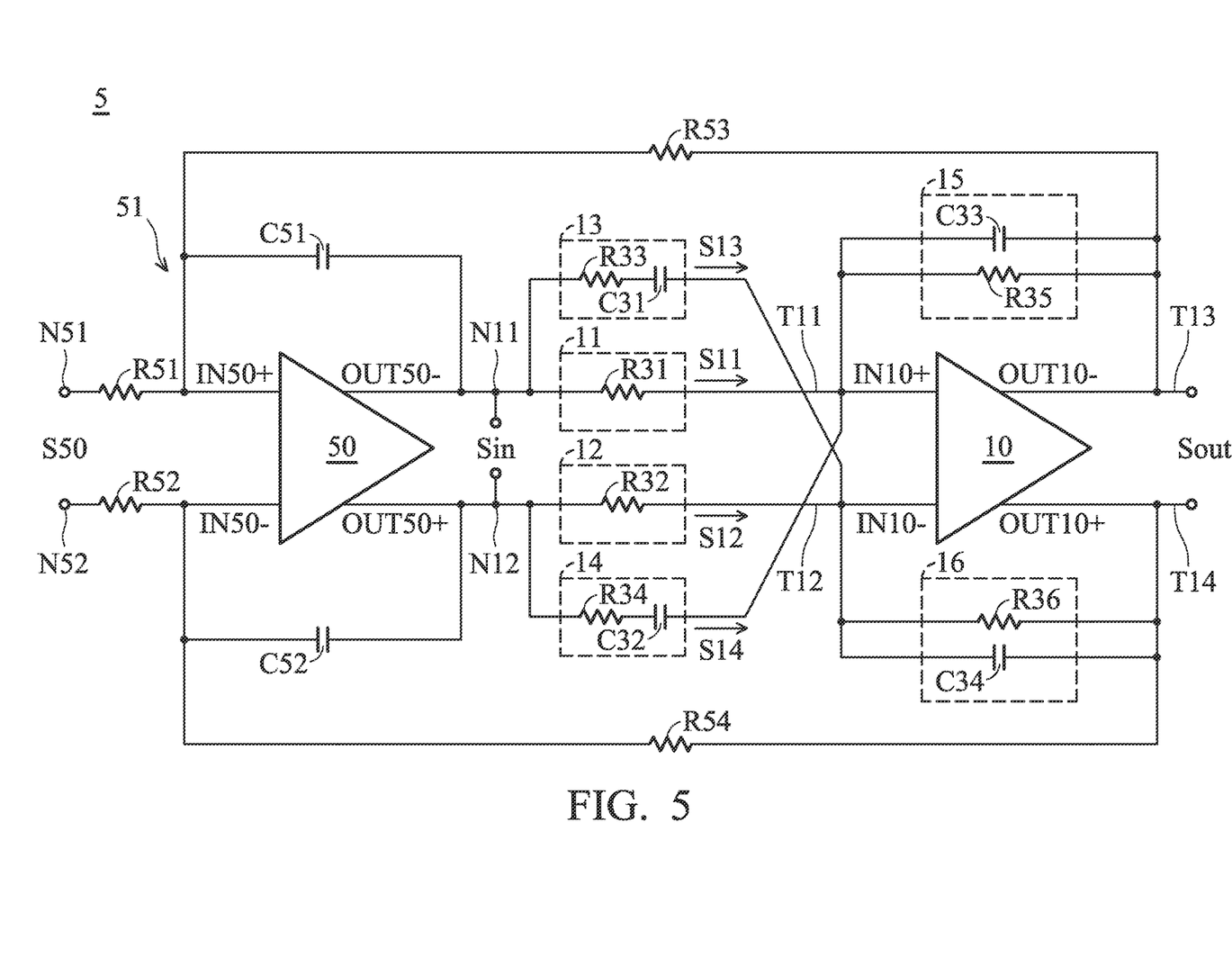
FIG. 5 shows an exemplary embodiment of a third-order filter.

In the above embodiments, the filter 1 is given as a second-order filter. However, the present invention is not limited thereto. In other embodiments, a third-order filter can be implemented based on the structure of the filter 1 in FIG. 3A or 4. Referring to FIG. 5, a filter 5 comprises the operational amplifier 10, the input networks 11 and 12, the high-pass networks 13 and 14, and the feedback networks 15 and 16 of FIG. 3A, and, thus, the related description is omitted here. The filter 5 further comprises an operational amplifier 50, resistors R51-R54, and capacitors C51 and C52. The operational amplifier 50 has a positive input terminal IN50+, a negative input terminal IN50−, a positive output terminal OUT50+, and a negative output terminal OUT50−. The resistor R51 has one terminal coupled to a differential node N51 and the other terminal coupled to the positive input terminal IN50+. The resistor R52 has one terminal coupled to a differential node N52 and the other terminal coupled to the negative input terminal IN50−. The capacitor C51 is coupled between the positive input terminal IN50+ and the negative output terminal OUT50−. The capacitor C52 is coupled between the negative input terminal IN50− and the positive output terminal OUT50+. The resistor R53 is coupled between the positive input terminal IN50+ and the negative output terminal OUT10−. The resistor R54 is coupled between the negative input terminal IN50− and the positive output terminal OUT10+. According to the connection structure described above, the operational amplifier 50, the resistors R51 and R52, and the capacitors C51 and C52 collectively operate as an integrator circuit 51, which contributes one stage of the third-order filter 5. The integrator circuit 51 receives a front-end signal S50 by the differential nodes N51 and N52 and generates the input signal Sin at the differential nodes N11 and N12. The integrator circuit 51 introduces one pole in the frequency response. Moreover, the operational amplifier 10, the input networks 11 and 12, the high-pass networks 13 and 14, and the feedback networks 15 and 16 collectively operate to introduce two poles in the frequency response. Thus, there are three poles in the frequency response introduced for the front-end signal S50 which serves as a signal input to the filter 5. As compared with conventional third-order filters, one operational amplifier is saved, thereby saving chip area and cost. In the embodiment, the operational amplifier 50 may be implemented by a multi-stage operational amplifier.

Figure 6:
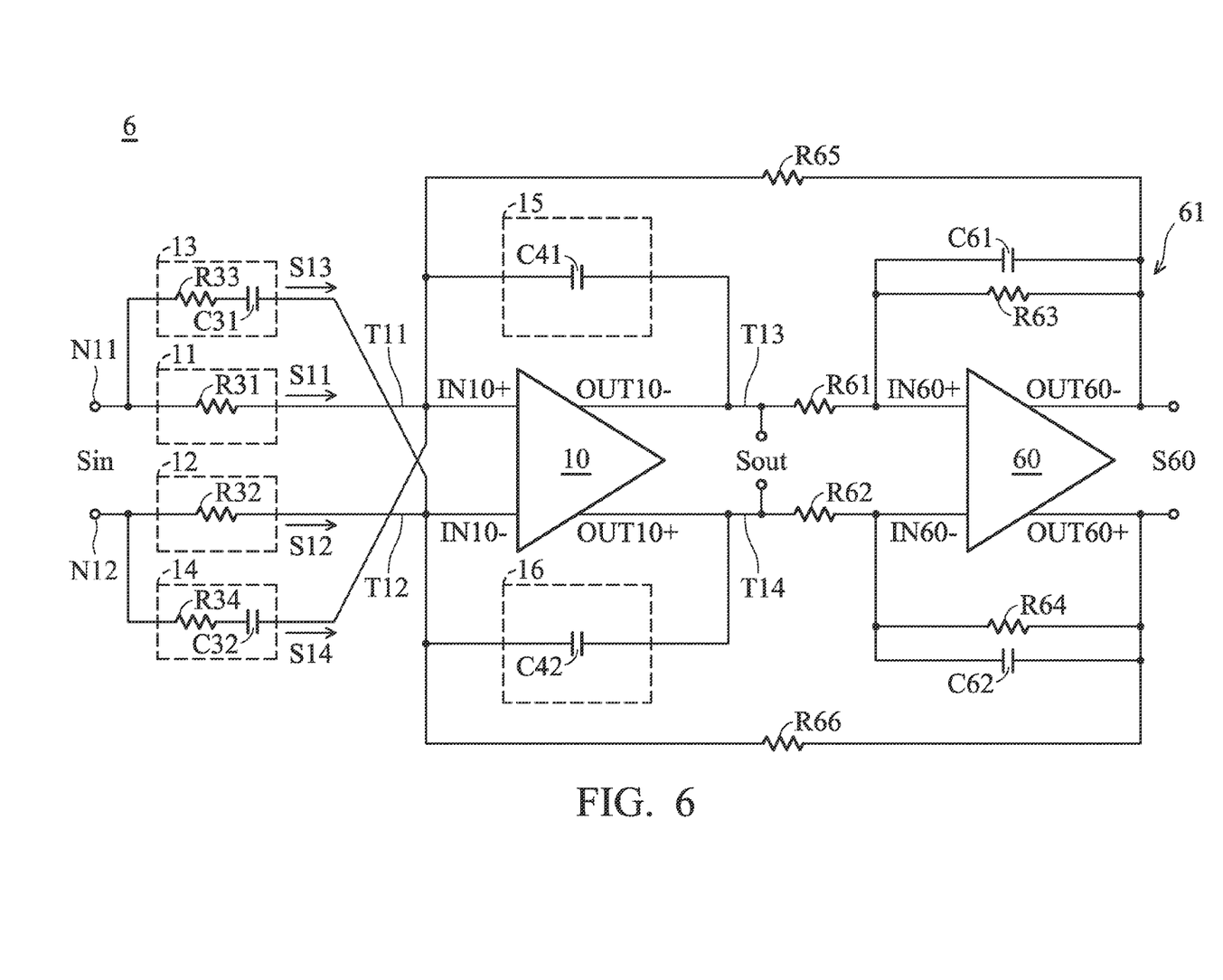
FIG. 6 shows another exemplary embodiment of a third-order filter.

In another embodiment, a third-order filter is implemented based on the structure of the filter 1 in FIG. 4. Referring to FIG. 6, a filter 6 comprises the operational amplifier 10, the input networks 11 and 12, the high-pass filter 13 and 14, and the feedback networks 15 and 16 of FIG. 4, and, thus, the related description is omitted here. The filter 6 further comprises an operational amplifier 60, resistors R61-R66, and capacitors C61 and C62. The operational amplifier 60 has a positive input terminal IN60+, a negative input terminal IN60−, a positive output terminal OUT60+, and a negative output terminal OUT60−. The resistor R61 has one terminal coupled to the negative output terminal OUT10− and the other terminal coupled to the positive input terminal IN60+. The resistor R62 has one terminal coupled to the positive output terminal OUT10+ and the other terminal coupled to the negative input terminal IN60−. The resistor R63 and the capacitor C61 are coupled between the positive input terminal IN60+ and the negative output terminal OUT60−. The resistor R64 and the capacitor C62 are coupled between the negative input terminal IN60− and the positive output terminal OUT60+. The resistor R65 is coupled between the positive input terminal IN10+ and the negative output terminal OUT60−. The resistor R66 is coupled between the negative input terminal IN10− and the positive output terminal OUT60+. According to the connection structure described above, the operational amplifier 60, the resistors R61-R64, and the capacitors C61 and C62 collectively operate as a filter circuit 61, which contributes one stage of the third-order filter 6. The filter 61 receives the output signal Sout at the positive output terminal OUT10+ and the negative output terminal OUT 10− and generates a back-end signal S60 at the positive output terminal OUT60+ and the negative output terminal OUT60−. The filter circuit 61 introduces one pole in the frequency response. Moreover, the operational amplifier 10, the input networks 11 and 12, the high-pass networks 13 and 14, and the feedback networks 15 and 16 collectively operate to introduce two poles in the frequency response. Thus, there are three poles in the frequency response introduced for the input signal Sin which serves as a signal input to the filter 6. As compared with conventional third-order filters, one operational amplifier is saved, thereby saving chip area and cost. In the embodiment, the operational amplifier 60 may be implemented by a multi-stage operational amplifier.

According to the embodiments of FIGS. 5 and 6, each of the filters 5 and 6 can perform a third-order filtering operation to the input signal Sin by using two operation amplifiers. The value (=2) of the order of each of the filters 5 and 6 is larger than the number of operation amplifiers (=1) in the filter.

Figure 7:
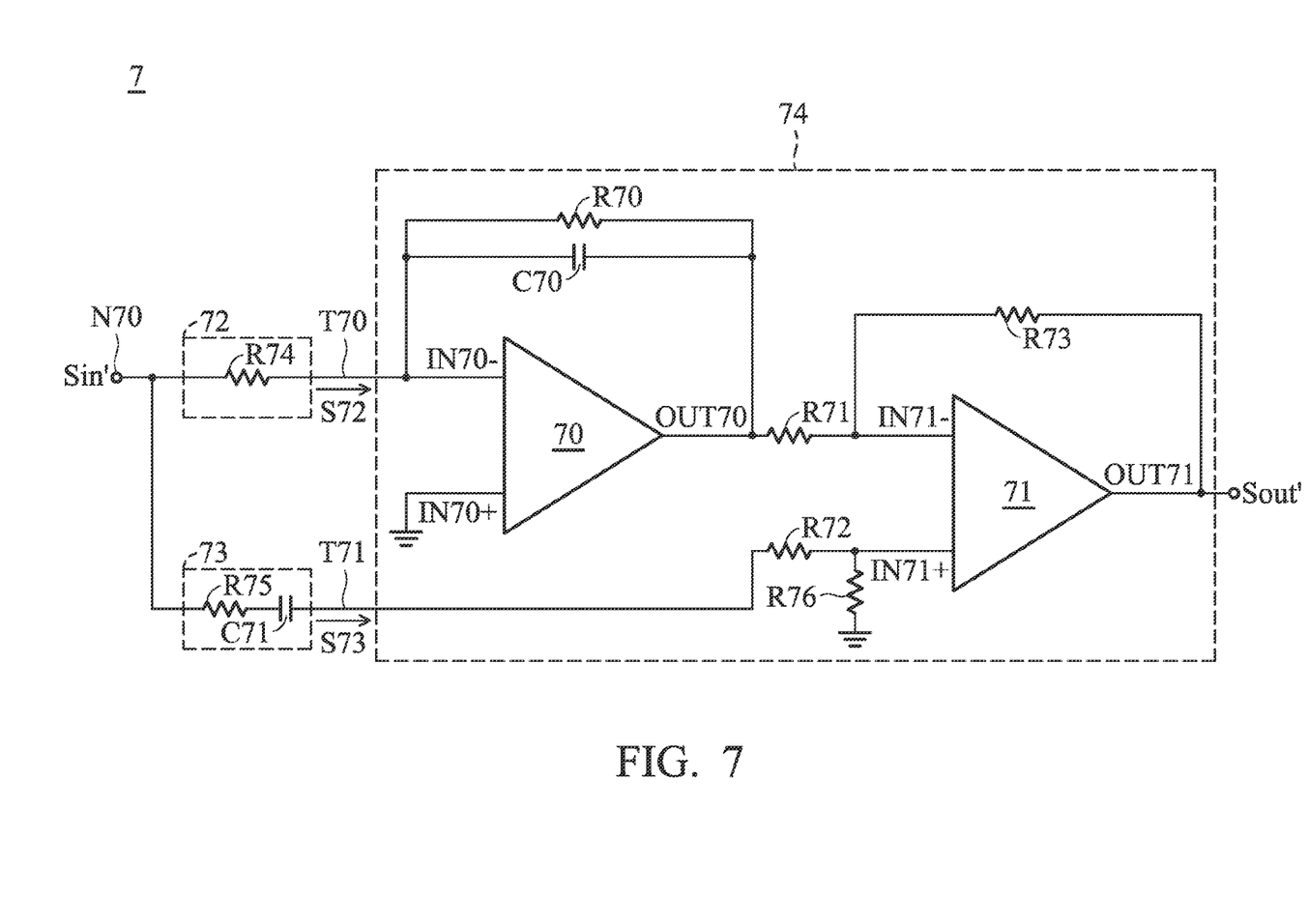
FIG. 7 shows further another exemplary embodiment of a second-order filter.

In the above embodiments, the operational amplifier 10, 50, and 60 are differential-type operational amplifiers. In another embodiment, a filter comprises a single-end operational amplifier. In the embodiment of FIG. 7, a filter 7 is a second-order filter. The second-order filter 7 receives an input signal Sin' at an input node N70 and generates an output signal Sout' according to the input signal Sin'. Referring to FIG. 7, the filter 7 comprises single-end operational amplifiers 70 and 71, an input network 72, a high-pass network 73, resistors R70-R73 and R76, and a capacitor C70. The operational amplifiers 70 and 71, the resistors R70-R73 and R76, and the capacitor C70 form an operational circuit 74. The operational amplifier 70 has a positive input terminal IN70+ coupled to a reference ground, a negative input terminal IN70− coupled to an input terminal T70 of the operational circuit 74, and an output terminal OUT70. The resistor R70 and the capacitor C70 are coupled in parallel between the negative input terminal IN70− and the output terminal OUT70. The operational amplifier 71 has a positive input terminal IN71+ coupled to the reference ground through the resistor R76, a negative input terminal IN71−, and an output terminal OUT71. The resistor R71 has one terminal coupled to the output terminal OUT70 and the other terminal coupled to the negative input terminal IN71−. The resistor R72 has one terminal coupled to an input terminal T71 of the operational circuit 74 and the other terminal coupled to the positive input terminal IN71+. The resistor R73 is coupled between the negative input terminal IN71− and the output terminal OUT71. The resistor R76 is coupled between the positive input terminal IN71+ and the reference ground. The input network 72 is coupled between the input node N70 and the negative input terminal IN70− (that is the input terminal T70). The input network 72 provides a normal path for the input signal Sin' to generate a corresponding normal signal S72, wherein the normal signal S72 has the same frequency components as the input signal Sin'. The high-pass network 73 is coupled between the input node N70 and the one terminal of the resistor R72 (that is the input terminal T71). The high-pass network 73 provides a high-pass path for the input signal Sin' to generate a corresponding high-pass signal S73. The high-pass network 73 filters the low-frequency components of the input signal Sin' to generate the high-pass signal S73, such that the high-pass signal S73 has only the high-frequency components of the input signal Sin'.

Referring to FIG. 7, the input network 72 comprises a resistor R74. The resistor R74 has one terminal coupled to the input node N70 for receiving the input signal Sin' and the other terminal coupled to the negative input terminal IN70−. According to the connection structure shown in FIG. 7, the operational amplifier 70, the resistors R70 and R74, and the capacitor C70 collectively operate as a low-pass filter to filter the high-frequency components. This low-pass filter introduces one pole in the frequency response. The filtered input signal Sin' is generated at the output terminal OUT70.

Referring to FIG. 7, the high-pass network 73 comprises a resistor R75 and a capacitor C71 which are coupled in series between the input node N70 and the one terminal of the resistor R72 (that is the input terminal T71). According to the operation of the resistor R75 and the capacitor C71, the low-frequency components of the input signal Sin' is filtered to generate the high-pass signal S73. The operational amplifier 71 and the resistors R71-R73 and R76 collectively operate to receive the filtered input signal Sin' and the high-pass signal S73. According to the operations of the operational amplifier 71 and the resistors R71-73 and R76, a subtraction operation is equivalently performed to the filtered input signal Sin' and the high-pass signal S73 to accomplish a low-pass filtering operation. Accordingly, the high-pass network 73 introduces another pole in the frequency response for the input signal Sin'. There are two poles in the frequency response introduced by the filter 7. Thus, the filter 7 performs a second-order filtering operation to the input signal Sin'.

According to the above embodiments, a high-pass network which is coupled to an operational circuit is applied to introduce an extra pole in the frequency response.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A filter for receiving an input signal and generating an output signal according to the input signal, comprising:
   a first input network connected to receive the input signal for providing a first normal path for the input signal to generate a first normal signal, wherein the first normal signal has the same frequency components as the input signal;
   a first high-pass network connected to receive the input signal for providing a first high-pass path for the input signal to generate a first high-pass signal;
   an operational circuit having a first input terminal and a second input terminal, wherein a polarity of the second input terminal is inverse to a polarity of the first input terminal; and
   a second input network providing a second normal path for the input signal to generate a second normal signal; and
   a second high-pass network providing a second high-pass path for the input signal to generate a second high-pass signal,
   wherein the operational circuit receives the first normal signal by the first input terminal and the first high-pass signal by the second input terminal such that a subtraction operation is performed on the first normal signal and the first high-pass signal to accomplish a filtering operation for generating the output signal;
   wherein the operational circuit receives the second normal signal by the second input terminal and the second high-pass signal by the first input terminal such that the subtraction operation is performed on the second normal signal and the second high-pass signal to accomplish the low-pass filtering operation for generating the output signal.

2. The filter as claimed in claim 1,
   wherein the second input network comprises a first resistor which has a first terminal receiving the input signal and a second terminal coupled to the second input terminal of the operational circuit, and
   wherein the second high-pass network comprises a second resistor and a first capacitor coupled in series between the first terminal of the first resistor and the first input terminal of the operational circuit.

3. The filter as claimed in claim 2, wherein a resistance of the first resistor is substantially equal to a resistance of the second resistor.

4. The filter as claimed in claim 1, further comprising:
   an integrator circuit, coupled to the first and second input networks and the first and second high-pass networks, receiving a front-end signal and generating the input signal according to the front-end signal.

5. The filter as claimed in claim 4, wherein the integrator circuit comprises:
   a first operational amplifier having a positive input terminal, a negative input terminal, a positive output terminal coupled to the second input network and the second high-pass network, and a negative output terminal coupled to the first input network and the first high-pass network;

a first resistor having a first terminal and a second terminal, wherein the second terminal of the first resistor is coupled to the positive input terminal of the first operation amplifier;

a first capacitor coupled between the positive input terminal and the negative output terminal of the first operation amplifier;

a second resistor having a first terminal and a second terminal, wherein the second terminal of the second resistor is coupled to the negative input terminal of the first operation amplifier; and a second capacitor coupled between the negative input terminal and the positive output terminal of the first operation amplifier, wherein the first terminals of the first and second resistors receive the front-end signal, and the input signal is generated between the positive output terminal and the negative output terminal of the first operational amplifier, wherein the operational circuit further has a first output terminal and a second output terminal, wherein a polarity of the first output terminal is inverse to the polarity of the first input terminal, and a polarity of the second output terminal is inverse to the polarity of the second input terminal, and wherein the filter further comprises a third resistor coupled between the positive input terminal of the first operational amplifier and the first output terminal of the operational circuit and a fourth resistor coupled between the negative input terminal of the first operational amplifier and the second output terminal of the operational circuit.

6. A filter for receiving an input signal and generating an output signal according to the input signal, comprising:

a first input network connected to receive the input signal for providing a first normal path for the input signal to generate a first normal signal, wherein the first normal signal has the same frequency components as the input signal;

a first high-pass network connected to receive the input signal for providing a first high-pass path for the input signal to generate a first high-pass signal;

an operational circuit having a first input terminal and a second input terminal, wherein a polarity of the second input terminal is inverse to a polarity of the first input terminal;

a first operational amplifier having a positive input terminal coupled to the first input terminal of the operational circuit, a negative input terminal coupled to the second input terminal of the operational circuit, a positive output terminal, and a negative output terminal; and a first feedback network coupled between the positive input terminal and the negative output terminal of the first operational amplifier;

wherein the output signal is generated between the positive output terminal and the negative output terminal of the first operational amplifier.

7. The filter as claimed in claim 6, wherein the first feedback network comprises a first resistor and a first capacitor which are coupled in parallel between the positive input terminal and the negative output terminal of the first operational amplifier.

8. The filter as claimed in claim 6,
wherein the first feedback network comprises a first capacitor coupled between the positive input terminal and the negative output terminal of the first operational amplifier.

9. The filter as claimed in claim 6, further comprising:
a filter circuit, coupled to the positive output terminal and the negative output terminal of the first operational amplifier, receiving the output signal and generating a back-end signal, wherein the back-end signal is a filtered modification the output signal.

10. The filter as claimed in claim 9, wherein the filter circuit comprises:

a second operational amplifier having a positive input terminal, a negative input terminal, a positive output terminal, and a negative output terminal, a first resistor having a first terminal coupled to the negative output terminal of the first operational amplifier and a second terminal coupled to the positive input terminal of the second operational amplifier;

a second resistor and a first capacitor coupled in parallel between the positive input terminal and the negative output terminal of the second operation amplifier;

a third resistor having a first terminal coupled to the positive output terminal of the first operational amplifier and a second terminal coupled to the negative input terminal of the second operational amplifier; and a fourth resistor and a second capacitor coupled in parallel between the negative input terminal and the positive output terminal of the second operation amplifier, wherein the first terminals of the first and third resistors receive the output signal, and the back-end signal is generated between the positive output terminal and the negative output terminal of the second operational amplifier, and wherein the filter further comprises a fifth resistor coupled between the positive input terminal of the first operational amplifier and the negative output terminal of the second operational amplifier and a sixth resistor coupled between the negative input terminal of the first operational amplifier and the positive output terminal of the second operational amplifier.

11. A filter for receiving an input signal and generating an output signal according to the input signal, comprising:

a first input network connected to receive the input signal for providing a first normal path for the input signal to generate a first normal signal, wherein the first normal signal has the same frequency components as the input signal;

a first high-pass network connected to receive the input signal for providinq a first high-pass path for the input signal to generate a first high-pass signal; and an operational circuit having a first input terminal and a second input terminal, wherein a polarity of the second input terminal is inverse to a polarity of the first input terminal;

wherein the operational circuit receives the first normal signal by the first input terminal and the first high-pass signal by the second input terminal such that a subtraction operation is performed on the first normal signal and the first high-pass signal to accomplish a filtering operation for generating the output signal;

wherein the first input network comprises a first resistor which has a first terminal receiving the input signal and a second terminal coupled to the first input terminal of the operational circuit, and wherein the first high-pass network comprises a second resistor and a first capacitor coupled in series between the first terminal of the first resistor and the second input terminal of the operational circuit.

12. The filter as claimed in claim 11, wherein a resistance of the first resistor is substantially equal to a resistance of the second resistor.

13. A filter for receiving an input signal and generating an output signal according to the input signal, comprising:
   a first input network connected to receive the input signal for providing a first normal path for the input signal to generate a first normal signal, wherein the first normal signal has the same frequency components as the input signal;
   a first high-pass network connected to receive the input signal for providing a first high-pass path for the input signal to generate a first high-pass signal;
   an operational circuit having a first input terminal and a second input terminal, wherein a polarity of the second input terminal is inverse to a polarity of the first input terminal;
   a first operational amplifier having a positive input terminal coupled to a reference ground, a negative input terminal coupled to the first input terminal of the operational circuit, and an output terminal;
   a first resistor and a capacitor coupled in parallel between the negative input terminal and the output terminal of the first operational amplifier;
   a second resistor having a first terminal coupled to the output terminal of the first operational amplifier and a second terminal;
   a second operational amplifier having a positive input terminal coupled to the reference ground, a negative input terminal coupled to the second terminal of the second resistor, and an output terminal;
   a third resistor has a first terminal coupled to the second input terminal of the operational circuit and a second terminal coupled to the positive input terminal of the second operational amplifier;
   a fourth resistor coupled between the negative input terminal and the output terminal of the second operational amplifier, and
   a fifth resistor coupled between the positive input terminal of the second operational amplifier and the reference ground;
   wherein the output signal is generated at the output terminal of the second operational amplifier.

14. The filter as claimed in claim 13,
   wherein the first input network comprises a sixth resistor which has a first terminal receiving the input signal and a second terminal coupled to the negative input terminal of the first operational amplifier, and
   wherein the first high-pass network comprises a seventh resistor and a second capacitor coupled in series between the first terminal of the sixth resistor and the first terminal of the third resistor.

15. A filter for receiving an input signal at a first differential node and a second differential node and generating an output signal according to the input signal, comprising:
   an operational amplifier having a positive input terminal, a negative input terminal, a positive output terminal, and a negative output terminal,
   a first input network, coupled between the first differential node of the filter and the positive input terminal of the operational amplifier, providing a first normal path for the input signal to generate a first normal signal, wherein the first normal signal has the same frequency components as the input signal;
   a first high-pass network, coupled between the first differential node of the filter and the negative input terminal of the operational amplifier, providing a first high-pass path for the input signal to generate a first high-pass signal;
   a second input network, coupled between the second differential node of the filter and the negative input terminal of the operational amplifier, providing a second normal path for the input signal to generate a second normal signal;
   a second high-pass network, coupled between the second differential node of the filter and the positive input terminal of the operational amplifier, providing a second high-pass path for the input signal to generate a second high-pass signal;
   a first feedback network coupled between the positive input terminal and the negative output terminal of the operational amplifier; and
   a second feedback network coupled between the negative input terminal and the positive output terminal of the operational amplifier.

16. The filter as claimed in claim 15, wherein an extra pole is introduced by coupling the first high-pass network to the negative input terminal of the operational amplifier and coupling the second high-pass network to the positive input terminal of the operational amplifier.

17. The filter as claimed in claim 15,
   wherein the first high-pass network comprises a first resistor and a first capacitor coupled in series between the first differential node of the filter and the negative input terminal of the operational amplifier, and
   wherein the second high-pass network comprises a second resistor and a second capacitor coupled in series between the second differential node of the filter and the positive input terminal of the operational amplifier.

18. The filter as claimed in claim 17,
   wherein the first input network comprises a third resistor which has a first terminal coupled to the first differential node of the filter and a second terminal coupled to the positive input terminal of the operational amplifier, and
   wherein the second input network comprises a fourth resistor which has a first terminal coupled to the second differential node of the filter and a second terminal coupled to the negative input terminal of the operational amplifier.

19. The filter as claimed in claim 18, wherein resistance values of the first, second, third, and fourth resistors are substantially equal.

* * * * *